(12) United States Patent
Rossi et al.

(10) Patent No.: US 11,726,146 B2
(45) Date of Patent: Aug. 15, 2023

(54) CONTACT CONNECTIVITY

(71) Applicant: Hewlett-Packard Development Company, L.P., Spring, TX (US)

(72) Inventors: John Michael Rossi, Vancouver, WA (US); Erik Donald Ness, Vancouver, WA (US); Scott Alan Linn, Corvallis, OR (US); James Michael Gardner, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 99 days.

(21) Appl. No.: 17/251,951

(22) PCT Filed: Feb. 6, 2019

(86) PCT No.: PCT/US2019/016830
§ 371 (c)(1),
(2) Date: Dec. 14, 2020

(87) PCT Pub. No.: WO2020/162922
PCT Pub. Date: Aug. 13, 2020

(65) Prior Publication Data
US 2021/0373090 A1    Dec. 2, 2021

(51) Int. Cl.
*B41J 2/175*     (2006.01)
*G01R 31/68*    (2020.01)
*G01R 31/28*    (2006.01)

(52) U.S. Cl.
CPC .......... *G01R 31/68* (2020.01); *B41J 2/17546* (2013.01); *G01R 31/2853* (2013.01)

(58) Field of Classification Search
CPC .................................................... B41J 2/17546
See application file for complete search history.

(56) References Cited

U.S. PATENT DOCUMENTS 5,363,134 A    11/1994   Barbehenn et al.
5,870,408 A     2/1999   Aggarwal et al.
(Continued)

FOREIGN PATENT DOCUMENTS

KR    20140008427    1/2014

OTHER PUBLICATIONS

4D Systems Datasheet, 4.3" Embedded SPI Display, Retrieved from www.4dsystems.com.au, Oct. 15, 2019, 10 pgs.
(Continued)

*Primary Examiner* — Jason S Uhlenhake
(74) *Attorney, Agent, or Firm* — Brooks, Cameron & Huebsch, PLLC

(57) ABSTRACT

Examples of an electronic device are described. In some examples, the electronic device includes a first shared line of a plurality of first contacts to respectively connect to a plurality of integrated circuits, a plurality of second lines of respective second contacts to respectively connect to the plurality of integrated circuits, and a third shared line of a plurality of third contacts to respectively connect to the plurality of integrated circuits. In some examples, the electronic device includes circuitry to determine whether one of the third contacts is connected to an integrated circuit based on a state of the first shared line and a state of one of the second lines that is associated with the one of the third contacts.

20 Claims, 6 Drawing Sheets

(56) References Cited

U.S. PATENT DOCUMENTS

| | | |
|---|---|---|
| 6,551,844 B1 | 4/2003 | Eldridge et al. |
| 6,963,212 B2 | 11/2005 | Brown |
| 6,986,085 B2 | 1/2006 | Rearick et al. |
| 7,026,646 B2 | 4/2006 | Cowles et al. |
| 2003/0002080 A1 | 1/2003 | Asauchi |
| 2005/0093568 A1 | 5/2005 | Ohara |
| 2007/0200571 A1 | 8/2007 | Quinn et al. |
| 2014/0063090 A1* | 3/2014 | Kosugi ............... B41J 2/17546 347/7 |

OTHER PUBLICATIONS

Dhaker, Piyu, Introduction to SPI Interface, Analog Dialogue 52-09, Sep. 2018, Retrieved from analogdialogue.com, 5 pgs.

* cited by examiner

CONTACT CONNECTIVITY

BACKGROUND

Electronic devices include electronic circuitry that functions based on electrical properties of the circuitry. For example, electronic circuitry may rely on voltage(s) and/or the flow of current(s) throughout the electronic circuitry. Electronic circuitry may include components such as resistors, capacitors, transistors, inductors, etc. The components of electronic circuitry may be used to establish the electrical properties of the circuitry and how voltages and/or currents in the circuitry behave.

DETAILED DESCRIPTION

Figure 1:
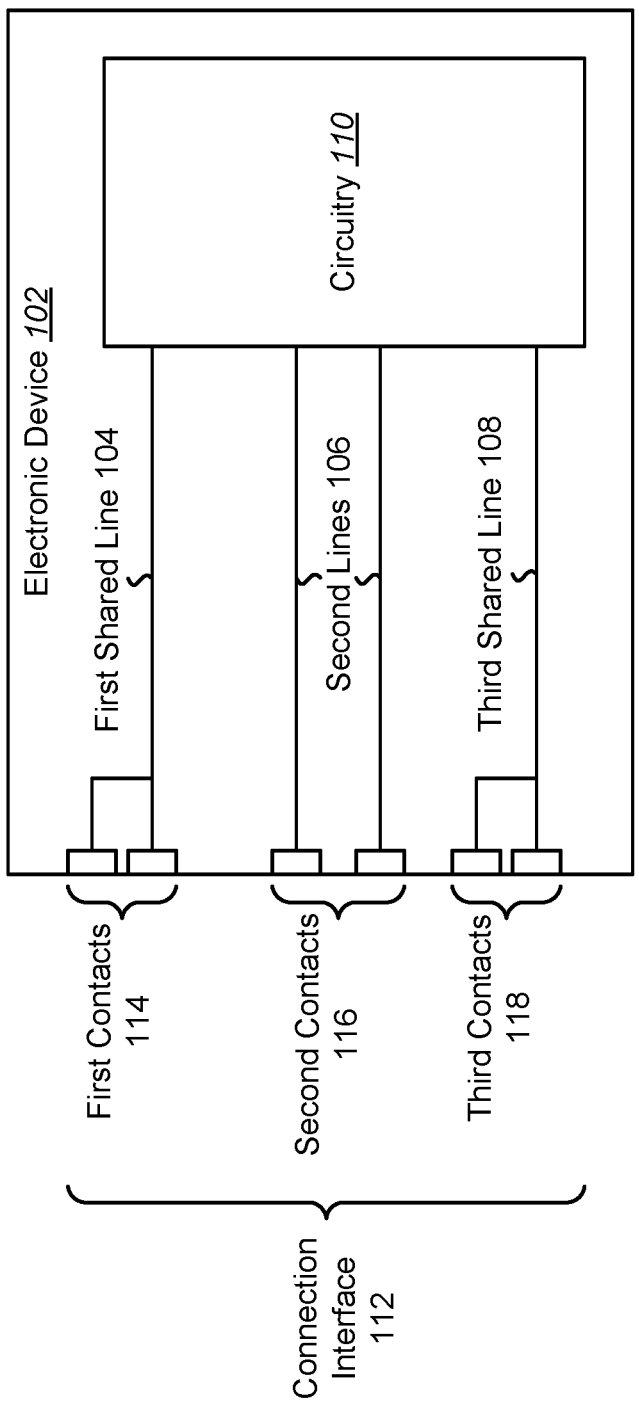
FIG. 1 is a block diagram illustrating an example of an electronic device having contacts with shared lines.

Some electronic devices may interface with other electronic devices. For example, some electronic devices may include electrical contacts to interface with other electronic devices. When connected, the contacts may be utilized to provide power between devices and/or to communicate between devices.

An electronic device may include a connection interface to connect to another electronic device or devices. The connection interface may include contacts to connect to contact pads on another electronic device. The contact(s) may be electrical contacts (e.g., electrical structures, plates, prongs, etc.) for interfacing with (e.g., touching) counterpart contact pad(s) on the other electronic device. For example, the contacts may be metallic contacts capable of communicating electrical or electronic signals. For instance, the contacts may supply power and/or signals (e.g., data) to corresponding contact pads on another electronic device or devices.

Some examples of electronic devices are printers. Printers may be utilized as examples of electronic devices implemented in accordance with some of the techniques and structures described herein. While some examples may be described in terms of printers and/or print cartridges, it should be noted that some of the examples described herein may be implemented in other electronic devices. For instance, some of the techniques and/or structures described herein may be implemented in a variety of electronic devices that interface with other electronic devices. For example, electronic devices with interfacing removable electronic components, connection interfaces, ports, etc., may be implemented in accordance with some of the examples described herein.

A print cartridge is a device that supplies material (e.g., ink, toner, three-dimensional (3D) printing agents, etc.) to a print head or print heads. For example, a print cartridge may include a reservoir that stores material to supply to a print head or print heads. A print cartridge may include a print head or print heads. A print head is a device that dispenses material (e.g., ink, toner, three-dimensional (3D) printing agents, etc.). A print head may include an integrated circuit or circuits for dispensing the material. For example, a print head may be implemented in silicon that includes an integrated circuit or circuits. In some examples, a print head may include a die or dies (e.g., fluidic die) for dispensing the material. For example, a print head may be implemented in silicon dies (which may be referred to as slivers) and plastic. A print head may include or may be coupled to contact pads.

Some print heads and/or print cartridges include exposed contact pads that form an electrical connection to a printer when operating correctly. The contact pads (e.g., dimple flex connections) may be susceptible to contamination or damage. In some cases, incorrect user handling or insertion can result in damage to a contact pad or pads and/or damage to the contact or contacts on the printer.

Determining and/or verifying electrical connectivity for each individual contact (e.g., corresponding to contact pads on a print cartridge or cartridges, such as black and color cartridges) may be beneficial. For example, this may improve problem detection (e.g., troubleshooting), better safety and reliability of a print head, and/or a reduced rate of user returns and service calls.

In some examples, contacts may share a line. A line is a wire or electrical coupling. A shared line is a wire or electrical coupling that is coupled to multiple contacts. For example, an electrical or electronic signal on a shared line may be provided to all of the contacts of the shared line. It may be difficult to determine and/or verify connectivity for individual contacts that share a line. Some examples of the structures and/or techniques described herein may enable connectivity determination and/or verification for individual contacts that share a line. For example, individual contact connectivity may be verified for a print head or multiple print heads, where multiple contacts share a line. The terms "connectivity" and "connection" may refer to an electrical and/or electronic connection between a contact or contacts and a contact pad or pads. An "open" occurs when a contact and a counterpart contact pad are not physically touching, when there is no electrical connection, or when there is no reliable electrical connection (e.g., when there is an intermittent or attenuated connection that is not reliable to transmit power and/or communicate signals).

Throughout the drawings, identical reference numbers designate similar, but not necessarily identical, elements. The figures are not necessarily to scale, and the size of some parts may be exaggerated to more clearly illustrate the example shown. Moreover the drawings provide examples and/or implementations consistent with the description; however, the description is not limited to the examples and/or implementations provided in the drawings.

FIG. 1 is a block diagram illustrating an example of an electronic device 102 having contacts with shared lines. In the example of FIG. 1, the electronic device 102 includes a first shared line 104 of a plurality of first contacts 114, a plurality of second lines 106 of respective second contacts 116, and a third shared line 108 of a plurality of third contacts 118. While FIG. 1 illustrates first contacts 114, second contacts, and third contacts 118, other examples may include an additional set or sets of contacts with a shared line and/or an additional set or sets of contacts with respective lines. As described above, a shared line may share a signal with all of the contacts of the shared line. Respective lines are separate from or independent of each other. For example, respective lines may carry separate or independent signals.

In some examples, each set of contacts (e.g., first contacts 114, second contacts 116, third contacts 118, etc.) may be implemented to connect to a plurality of integrated circuits. For example, one of the first contacts 114, one of the second contacts 116, and one of the third contacts 118 may be implemented to connect to a first integrated circuit, and another of the first contacts 114, another of the second contacts 116, and another of the third contacts 118 may be implemented to connect to a second integrated circuit. While each set of contacts (first contacts 114, second contacts 116, third contacts 118) is illustrated as including two individual contacts in FIG. 1, each set of contacts may include more contacts in some examples. In some examples, different sets of contacts may include the same or a different number of contacts from each other. The electronic device 102 includes a connection interface 112. A connection interface 112 is an interface that includes multiple sets of contacts (e.g., first contacts 114, second contacts 116, and third contacts 118, etc.).

Some examples of the electronic device 102 include printers. For example, a printer may be implemented to connect to a print cartridge or cartridges, to a print head or heads, to an integrated circuit or circuits, and/or to a die or dies. For instance, each contact of the first contacts 114, second contacts 116, and third contacts 118 may be implemented to connect to counterpart contact pads of a print cartridge or cartridges, of a print head or heads, of an integrated circuit or circuits, and/or of a die or dies (e.g., slivers).

In some examples, the first shared line 104 may be a reset line. For example, the first shared line 104 may carry a reset signal to the first contacts 114. In some examples, the reset signal may cause a connected integrated circuit or circuits to reset. In some examples, each of the second lines 106 may be a respective data line. For example, each of the second lines 106 may carry a separate data signal to the respective second contacts 116. In some examples, the data signals may be supplied to a connected integrated circuit or circuits.

In some examples, the third shared line 108 may be a clock line, a sense line, or a mode line. For example, the third shared line 108 may carry a clock signal, a sense signal, or a mode signal for the third contacts 118. In some examples, the clock signal may be supplied to a connected integrated circuit or circuits (for operation timing, for instance). In some examples, the sense signal may be received from a connected integrated circuit or circuits (for sensing a condition, such as temperature, for instance). In some examples, the mode signal may be supplied to a connected integrated circuit or circuits (to indicate and/or command a mode of operation, for instance).

The electronic device 102 may include circuitry 110. Examples of the circuitry 110 include integrated circuitry, an application-specific integrated circuit (ASIC), a processor, microcontroller, field programmable gate array (FPGA), digital logic circuitry, and/or analog circuitry, etc. In some examples, the circuitry 110 may include and/or may be coupled to memory. For example, the circuitry 110 may include a processor, which may be any of a central processing unit (CPU), a semiconductor-based microprocessor, graphics processing unit (GPU), FPGA, ASIC, and/or other hardware device suitable for retrieval and execution of instructions stored in memory. The processor may fetch, decode, and/or execute instructions (e.g., contact connectivity determination instructions) stored in the memory. Additionally or alternatively, the processor may include an electronic circuit or circuits that include electronic components for performing a function or functions of the instructions. In some examples, the processor may perform one, some, or all of the functions, operations, elements, methods, etc., described in connection with one, some, or all of FIGS. 1-4B. In some examples, the memory may include executable instructions for one, some, or all of the functions, operations, elements, methods, etc., described in connection with one, some, or all of FIGS. 1-4B.

In some examples, the memory may be any electronic, magnetic, optical, or other physical storage device that contains or stores electronic information (e.g., instructions and/or data). The memory may be, for example, Random Access Memory (RAM), Electrically Erasable Programmable Read-Only Memory (EEPROM), a storage device, an optical disc, and the like. In some examples, the memory may be volatile and/or non-volatile memory, such as Dynamic Random Access Memory (DRAM), EEPROM, magnetoresistive random-access memory (MRAM), phase change RAM (PCRAM), memristor, flash memory, and the like. In some implementations, the memory may be a non-transitory tangible machine-readable storage medium, where the term "non-transitory" does not encompass transitory propagating signals. In some examples, the memory may include multiple devices (e.g., a RAM card and a solid-state drive (SSD)).

The circuitry 110 may be coupled to the contacts (e.g., first contacts 114, second contacts 116, and third contacts 118). For example, the circuitry 110 may be coupled to the first contacts 114 with the first shared line 104, to the second contacts 116 with respective second lines 106, and to the third contacts 118 with the third shared line. In some examples, the circuitry 110 may be coupled to another contact or contacts with a shared line or lines and/or with respective lines.

The circuitry 110 may determine connectivity of a contact or contacts. For example, the circuitry 110 may determine whether each of the first contacts 114 is connected to an integrated circuit or circuits, whether each of the second contacts 116 is connected to an integrated circuit or circuits, and/or where each of the third contacts 118 is connected to an integrated circuit or circuits. In some examples, the circuitry 110 may determine whether additional or alternative contacts (not shown in FIG. 1) are connected to an integrated circuit or circuits.

The circuitry 110 may use combinations of states on lines (e.g., the first shared line 104 and the second lines 106) to determine connectivity of a contact or contacts (e.g., of the third contacts 118). A state is an electrical or electronic state. For example, a state may be a particular voltage or logic level on a line and/or contact. A state may be controlled by the circuitry 110. For example, the circuitry 110 may drive a voltage or logic level on a line and/or contact. Some examples of states may indicate or correspond to a logic 0 and a logic 1.

In some examples, a measurement (e.g., voltage measurement, voltage level, etc.) corresponding to a contact on a shared line may vary based on a state on another shared line and a state on an individual line. The measurement may be utilized to determine whether the contact is connected. In some examples, the circuitry 110 may determine whether one of the third contacts 118 is connected to an integrated circuit based on a state of the first shared line 104 and a state of one of the second lines 106 that is associated with the one of the third contacts. For example, one of the second lines 106 may be associated with one of the third contacts 118. The association between contacts may be based on whether they are implemented to connect to a same integrated circuit. For example, one of the third contacts 118 may be associated with one of the second contacts 116 and/or a corresponding second line because the one of the third contacts 118 and the one of the second contacts 116 are implemented to be connected to the same integrated circuit (e.g., die).

In some examples, the circuitry 110 may use a combination of contact states to enable and disable pull circuits (e.g., pulldowns or pullups) on a per-integrated circuit (e.g., die) basis. A pulldown is circuitry that modifies an input voltage (e.g., pulls down the input voltage) when connected. A pullup is circuitry that modifies an input voltage (e.g., pulls up the input voltage) when connected. Pull circuits may be implemented in integrated circuits that are to be connected to the connection interface 112. Some examples herein are described with relation to pulldowns. Pullups may be alternatively implemented in other examples. In some examples, a pull circuit (e.g., a pulldown or pullup) corresponding to a contact pad and to a contact may be activated or deactivated based on states of associated contacts (e.g., contacts from other lines that are to connect to the same integrated circuit). For example, a pulldown corresponding to one of the third contacts 118 may be enabled when the state of the first shared line 104 (e.g., the reset line) is a first state (e.g., logic 0) and a state of one of the second lines 106 (e.g., a data line) is the first state (e.g., logic 0), but may be disabled when the state of the one of the second lines 106 (e.g., the data line) is a second state (e.g., logic 1).

Because the second lines 106 (and second contacts 116) are independent with respect to different integrated circuits, each of the second contacts 116 may be individually validated for connectivity. In some examples, validating connectivity of each of the second contacts 116 may be performed before determining connectivity of each of the third contacts 118. The second contacts 116 may be used to enable a pull circuit of one integrated circuit and disable other pull circuits of the rest of the integrated circuits or dies (at a time, for example). For example, a connection or connections to the integrated circuit with an enabled pull circuit or circuits may be determined (e.g., measured). For instance, the circuitry 110 may determine connectivity of the one of the third contacts 118 when a state of the first shared line 104 is a first state (e.g., logic 0) and the state of the one of the plurality of second lines 106 is the first state (e.g., logic 0), while a state of each other of the plurality of second lines 106 is a second state (e.g., logic 1). In some examples, the circuitry 110 may determine connectivity of each of the third contacts 118 by sequentially setting the state of each of the second lines 106 to the first state. For instance, contacts corresponding to an integrated circuit (e.g., die) can be measured with a corresponding data line low and pulldowns active.

In some examples of the techniques described herein, even with multiple contacts (and integrated circuits, dies, slivers, etc.) sharing lines, each contact may be individually measured and determined as having an expected connection resistance. An open or opens may be detected. In a case of a detected open or opens, the circuitry 110 may provide an indicator or indicators that an open or opens are detected and/or an indicator of a contact or contacts that are not connected. For example, the circuitry 110 may provide an indicator or indicators to be presented on a display, to be transmitted in a message (e.g., packet, text, email, etc.). For instance, a printer may include a display that presents the message and/or may transmit the message to another device (e.g., a computer, laptop, smartphone, tablet, etc.) for presentation.

In some examples, the electronic device 102 may include additional shared lines, each with a plurality of contacts. For example, the electronic device 102 may include a fourth shared line of a plurality of fourth contacts to respectively connect to the plurality of integrated circuits (not shown in FIG. 1). The circuitry 110 may determine whether one of the fourth contacts is connected to the integrated circuit based on the state of the first shared line 104 and the state of one of the second lines 106 that is associated with the one of the fourth contacts. In some examples, the electronic device 102 may include a fifth shared line of a plurality of fifth contacts to respectively connect to the plurality of integrated circuits (not shown in FIG. 1). The circuitry 110 is to determine whether one of the fifth contacts is connected to the integrated circuit based on the state of the first shared line 104 and the state of one of the second lines 106 that is associated with the one of the fifth contacts.

In some examples, the connection interface 112 may include a plurality of first contacts 114. A first signal (e.g., state, logic value, voltage, etc.) may be shared by all of the plurality of first contacts 114. The connection interface 112 may include a plurality of second contacts 116. Each of a plurality of second signals (e.g., states, logic values, voltages, etc.) may be independent for each of the plurality of second contacts. The connection interface 112 may include a plurality of third contacts 118. A third signal may be shared by all of the plurality of third contacts 118. Connectivity of one of the plurality of third contacts 118 is to be detected based on the first signal and one of the plurality of second signals. For example, the first signal and the one of the plurality of second signals may activate a first pulldown circuit and the first signal and another of the plurality of second signals may disable a second pulldown circuit.

Figure 2:
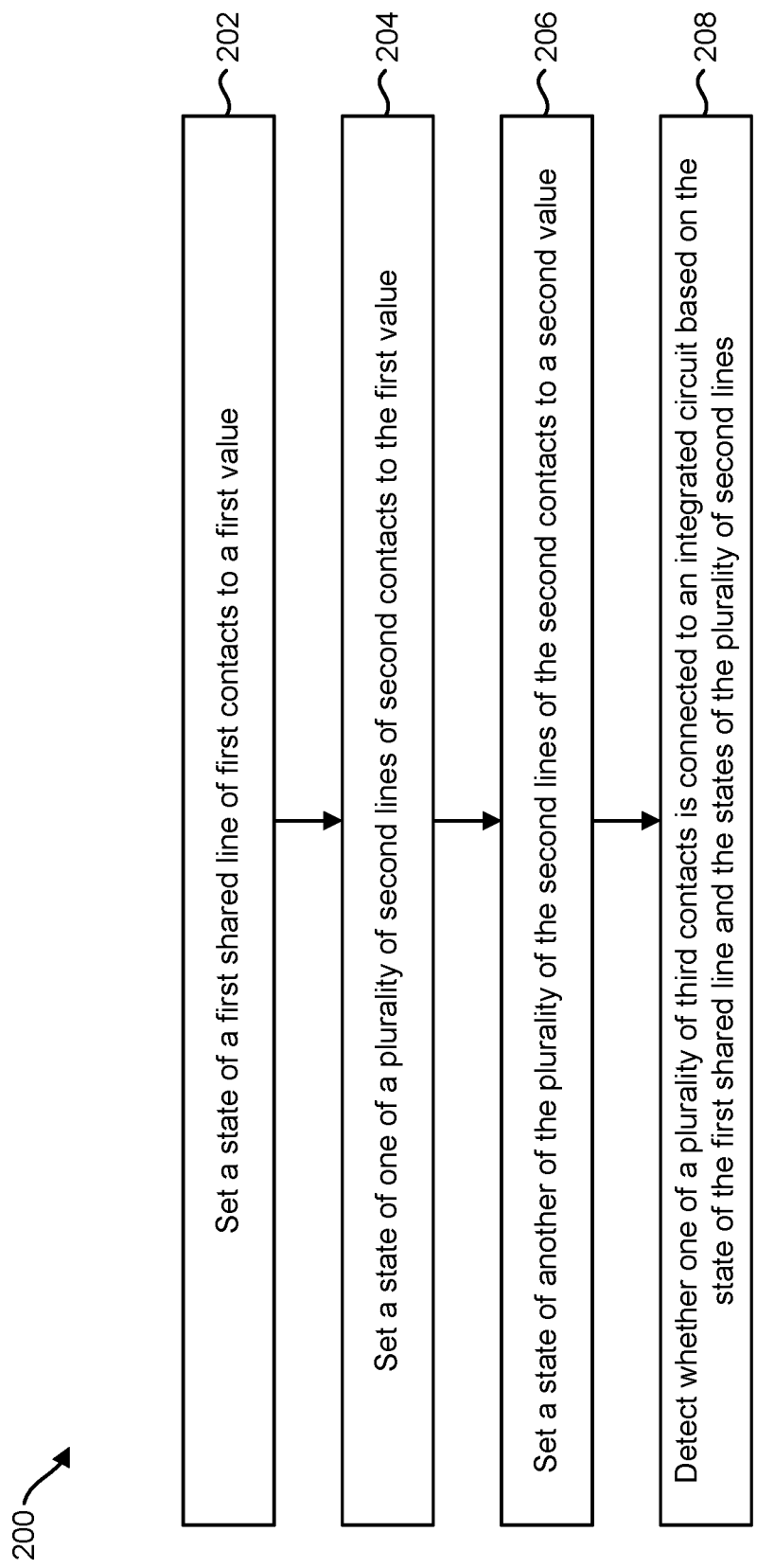
FIG. 2 is a flow diagram illustrating an example of a method for contact connectivity detection.

FIG. 2 is a flow diagram illustrating an example of a method 200 for contact connectivity detection. The method 200 may be performed by the electronic device 102 described in connection with FIG. 1.

The electronic device 102 (e.g., circuitry 110) may set 202 a state of a first shared line 104 of first contacts 114 to a first value. A value may be a logic value or a signal (e.g., voltage) corresponding to a logic value. In some examples, the first value may be 0, a "low" logic value, and/or a voltage below a threshold. For example, the electronic device 102 may drive the state of the first shared line 104 to the first value.

The electronic device 102 (e.g., circuitry 110) may set 204 a state of one of a plurality of second lines 106 of second contacts 116 to the first value (e.g., 0). For example, the electronic device 102 may drive the state of a second line 106 to the first value.

The electronic device 102 (e.g., circuitry 110) may set 206 a state of another of the plurality of second lines 106 of the second contacts 116 to a second value (e.g., 1). For example, the electronic device 102 may drive the state(s) of another second line or second lines to a second value. In some examples, the second value may be 1, a "high" logic value, and/or a voltage above a threshold. For example, the electronic device 102 may drive the state of one of the second lines 106 to the second value. In some examples, the electronic device 102 may drive the state of a set of the second lines 106 that is complementary to the one of the second lines 106 that is driven to the first value.

The electronic device 102 (e.g., circuitry 110) may detect 208 whether one of a plurality of third contacts 118 is connected to an integrated circuit based on the state of the first shared line 104 and the states of the plurality of second lines 106. This may be accomplished as described above in connection with FIG. 1. For example, the electronic device 102 (e.g., circuitry 110) may measure a voltage on one of the third contacts 118. The voltage may indicate whether a pull circuit (and hence an integrated circuit) is connected to the one of the third contacts. For instance, detecting 208 whether the one of the plurality of third contacts 118 is connected may include measuring a voltage of the one of the plurality of the third contacts 118 when the state of the first shared line 104 is set to 0, the state of the one of the plurality of second lines 106 is set to 0, and the state of the other of the plurality of second lines 106 is set to 1. Examples of techniques for determining or detecting whether a contact is connected are given with reference to FIGS. 4A and 4B.

Table (1) is a truth table illustrating examples of line states corresponding to pull circuit activity corresponding to the lines. In Table (1), the term "Active" denotes an active or enabled pull circuit, "Disabled" denotes an inactive or disabled pull circuit, and "X" indicates a "don't-care" term (a case where pull circuit activity does not depend on the state).

TABLE 1

| Line | First Shared Line State = 0 && Second Line State = 0 | First Shared Line State = 0 && Second Line State = 1 | First Shared Line State = 1 && Second Line State = X |
|---|---|---|---|
| First Shared Line | Active | Active | Disabled |
| Second Lines | Active | Active | Disabled |
| Third Shared Line | Active | Disabled | Disabled |

As can be observed in the example of Table (1), when the first shared line state is 0 and a second line state is 0, a pull circuit corresponding to the third shared line may be active. In this example, when the first shared line state is 0 and a second line state is 1, a pull circuit corresponding to the third shared line may be disabled. Accordingly, one of the second line states or values may be set to 0 while the remaining second line states or values may be set to 1. In this case, a third contact associated with the one of the second lines that is set to 0 may be measured to determine whether the third contact is connected (e.g., whether a corresponding pull circuit is active).

In some examples, the method 200 may include detecting an additional contact or contacts are connected. For example, the method 200 may include, in response to detecting that the one of the plurality of third contacts 118 is connected, detecting whether one of a plurality of fourth contacts is connected to the integrated circuit based on the state of the first shared line 104 and the states of the plurality of second lines 106.

Figure 3:
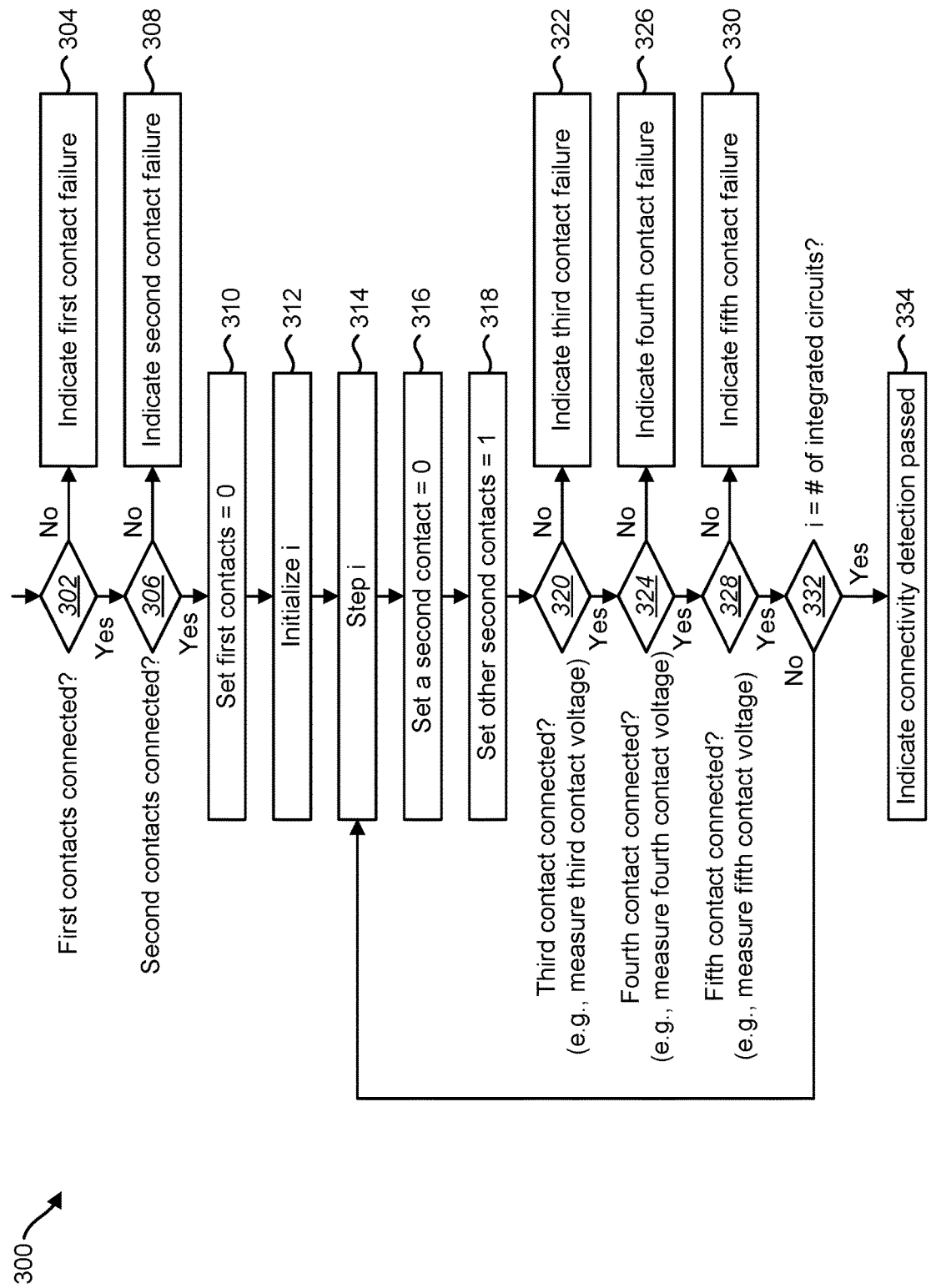
FIG. 3 is a flow diagram illustrating another example of a method for contact connectivity detection.

FIG. 3 is a flow diagram illustrating another example of a method 300 for contact connectivity detection. The method 300 may be performed by the electronic device 102 described in connection with FIG. 1.

The electronic device 102 (e.g., circuitry 110) may determine 302 whether first contacts are connected. Reset contacts may be examples of the first contacts 114 described in connection with FIG. 1. For example, a first line may be shared between multiple contacts that are to connect to multiple integrated circuits (e.g., dies or slivers, etc.). In some examples, the electronic device 102 may measure a voltage at a first contact or contacts to determine whether a pull circuit is connected or pull circuits are connected to the first contact or contacts. In some examples, this first connectivity check may indicate that one first contact is connected, though this first connectivity check may not necessarily indicate that all first contacts are connected. In some examples, individual first contact connectivity may be checked (e.g., additionally checked) in conjunction with second contact connectivity checks.

In a case that the first contacts are not connected, the electronic device 102 may indicate 304 first contact failure (e.g., reset contact failure). For example, the electronic device 102 may store an indicator in memory indicating that a first contact or contacts are not connected. Additionally or alternatively, the electronic device 102 may present an indicator on a display that indicates first contact failure. Additionally or alternatively, the electronic device 102 may send a message (e.g., packet, text message, email, chat message, etc.) that indicates first contact failure.

In a case that the first contacts are connected, the electronic device 102 (e.g., circuitry 110) may determine 306 whether second contacts are connected. Data contacts may be examples of the second contacts 116 described in connection with FIG. 1. For example, a plurality of second lines may be respectively coupled to multiple contacts that are to connect to multiple integrated circuits (e.g., dies or slivers, etc.). In some examples, the electronic device 102 may measure a voltage at each second contact to determine whether a pull circuit is connected to each second contact. In some examples, the second contact connectivity check may include two stages. In a first stage, each second contact may be checked to validate a pull circuit presence (e.g., active pull down circuit) when the first line is in a first logic state (e.g., 0). In a second stage, each second contact may be checked to validate a pull circuit absence (e.g., disabled pull down) when the first line is in a second logic state (e.g., 1). This two-stage check may be utilized to indirectly validate first connectivity on all shared first contacts and to verify second line (e.g., control line) connectivity for each of the second contacts.

In a case that a second contact is not connected or that second contacts are not connected, the electronic device 102 may indicate 308 second contact failure. For example, the electronic device 102 may store an indicator in memory indicating that a second contact or contacts are not connected. Additionally or alternatively, the electronic device 102 may present an indicator on a display that indicates second contact failure. Additionally or alternatively, the electronic device 102 may send a message (e.g., packet, text message, email, chat message, etc.) that indicates second contact failure.

In a case that the second contacts are connected, the electronic device 102 may set 310 or drive first (e.g., reset) contacts to 0. For example, the electronic device 102 may set a state of a first line to 0 (e.g., to a voltage representing logic 0).

The electronic device 102 may initialize i. In this example, i is an index or variable. For example, the value of i may correspond to an integrated circuit. For instance, assuming that a print cartridge includes four integrated circuits (e.g., dies), i=1 may correspond to a first integrated circuit, i=2 may correspond to a second integrated circuit, i=3 may correspond to a third integrated circuit, and i=4 may correspond to a fourth integrated circuit. Initializing 312*i* may include setting i to a value for iteration through the integrated circuits. For example, i may be initially set to 0. Other ranges and/or numbering schemes may be used for i in some examples.

The electronic device 102 may step 314*i*. For example, the electronic device 102 may increment (e.g., add to, increase) the value of i. For instance, the electronic device 102 may set i=i+1. In other examples, the electronic device 102 may initialize i to a high value (e.g., 5) and decrement (e.g., subtract from, decrease) the value of i to step through the integrated circuits.

The electronic device 102 may set 316 or drive a second contact and/or line (e.g., Data(i)) to 0. In this example, Data(i) denotes the i-th data contact and/or data line. For example, the electronic device 102 may set a state of an i-th data line to 0 (e.g., to a voltage representing logic 0).

The electronic device 102 may set 318 or drive other second contacts and/or lines (e.g., Data(n≠i)) to 1. In this example, Data(n≠i) denotes the n-th data contact or contacts and/or data line or lines that are not the i-th data contact and/or data line. For example, the electronic device 102 may set a state of all second contacts or lines that are not the i-th second contact or line to 1 (e.g., to a voltage representing logic 1). Driving 316 a second contact (e.g., Data(i)) to 0 and driving 318 other second contacts (e.g., Data(n≠i)) to 1 may prepare a contact on a shared line corresponding to the i-th second contact for connectivity determination or detection. In the example of FIG. 3, there are three contacts on shared lines (in addition to the first contacts) that are tested for connectivity for each integrated circuit: a third contact (e.g., a clock contact), a fourth contact (e.g., mode contact), and a fifth contact (e.g., sense contact). The clock contacts, mode contacts, and/or sense contacts may be examples of the third contacts 118 described in connection with FIG. 1.

The electronic device 102 may determine 320 or detect whether the third (e.g., Clock(i)) contact is connected. In this example, Clock(i) denotes the i-th contact on a shared clock line that is to connect to an i-th integrated circuit. For example, the electronic device 102 may measure a voltage on one of the third contacts (e.g., the Clock(i) contact). The voltage may indicate whether the third (e.g., Clock(i)) contact is connected to an i-th integrated circuit or not. For example, the i-th integrated circuit may include pull circuitry that, when active, varies the voltage on the third (e.g., Clock(i)) contact when connected.

In a case that the third (e.g., Clock(i)) contact is not connected (e.g., in a case that the measured voltage indicates an open), the electronic device 102 may indicate 322 third contact failure. For example, the electronic device 102 may store an indicator in memory indicating that the third (e.g., Clock(i)) contact is not connected. Additionally or alternatively, the electronic device 102 may present an indicator on a display that indicates that the third (e.g., Clock(i)) contact is not connected. Additionally or alternatively, the electronic device 102 may send a message (e.g., packet, text message, email, chat message, etc.) that indicates that the third contact is not connected.

In a case that the third (e.g., Clock(i)) contact is connected (e.g., the measured voltage indicates an active pull circuit), the electronic device 102 may determine 324 or detect whether the fourth (e.g., Mode(i)) contact is connected. In this example, Mode(i) denotes the i-th contact on a shared mode line that is to connect to an i-th integrated circuit. For example, the electronic device 102 may measure a voltage on the fourth (e.g., Mode(i)) contact. The voltage may indicate whether the fourth (e.g., Mode(i)) contact is connected to an i-th integrated circuit or not. For example, the i-th integrated circuit may include pull circuitry that, when active, varies the voltage on the fourth contact when connected.

In a case that the fourth (e.g., Mode(i)) contact is not connected (e.g., in a case that the measured voltage indicates an open), the electronic device 102 may indicate 326 fourth (e.g., Mode(i)) contact failure. For example, the electronic device 102 may store an indicator in memory indicating that the fourth contact is not connected. Additionally or alternatively, the electronic device 102 may present an indicator on a display that indicates that the fourth (e.g., Mode(i)) contact is not connected. Additionally or alternatively, the electronic device 102 may send a message (e.g., packet, text message, email, chat message, etc.) that indicates that the fourth contact is not connected.

In a case that the fourth (e.g., Mode(i)) contact is connected (e.g., the measured voltage indicates an active pull circuit), the electronic device 102 may determine 328 whether the fifth (e.g., Sense(i)) contact is connected. In this example, Sense(i) denotes the i-th contact on a shared sense line that is to connect to an i-th integrated circuit. For example, the electronic device 102 may measure a voltage on the fifth (e.g., Sense(i)) contact. The voltage may indicate whether the fifth contact is connected to an i-th integrated circuit or not. For example, the i-th integrated circuit may include pull circuitry that, when active, varies the voltage on the fifth (e.g., Sense(i)) contact when connected.

In a case that the fifth (e.g., Sense(i)) contact is not connected (e.g., in a case that the measured voltage indicates an open), the electronic device 102 may indicate 330 fifth contact failure. For example, the electronic device 102 may store an indicator in memory indicating that the fifth (e.g., Sense(i)) contact is not connected. Additionally or alternatively, the electronic device 102 may present an indicator on a display that indicates that the fifth contact is not connected. Additionally or alternatively, the electronic device 102 may send a message (e.g., packet, text message, email, chat message, etc.) that indicates that the fifth contact is not connected.

In a case that the fifth (e.g., Sense(i)) contact is connected (e.g., the measured voltage indicates an active pull circuit), the electronic device 102 may determine 332 whether i is equal to the number of integrated circuits. If i is equal to the number of integrated circuits, the electronic device 102 may indicate 334 that connectivity detection has passed. For example, if i has stepped through all of the integrated circuits to be tested, the electronic device 102 may indicate 334 that connectivity detection has passed. Indicating 334 that connectivity detection has passed may include storing an indicator in memory indicating that connectivity detection has passed (for all contacts, for instance). Additionally or alternatively, the electronic device 102 may present an indicator on a display that indicates that connectivity detection has passed. Additionally or alternatively, the electronic device 102 may send a message (e.g., packet, text message, email, chat message, etc.) that indicates that connectivity detection has passed. In other examples, the electronic device 102 may determine if another end condition is reached (e.g., all contacts have been tested for connectivity) and may indicate 334 that connectivity detection has passed when the end condition is reached.

As can be observed from the example described in connection with FIG. 3, a first line and second lines may be used to control pull circuit (e.g., pulldown) status on shared lines (e.g., fourth shared line, fifth shared line, and third shared line). As can be observed, connectivity of control lines (e.g., first line and second lines) may be validated prior to verifying connectivity of other shared lines in some examples.

In some examples, the sequence of line validation may be modified. For example, a sequence of third line, fourth line, and fifth line validation may be performed. In other examples, other sequences or orders may be performed. In some examples, the sequence of control line (e.g., first line and second lines) validation may be modified. For example, the connectivity of second contacts may be validated before the connectivity of first contacts, followed by validating other shared lines.

Figure 4A:
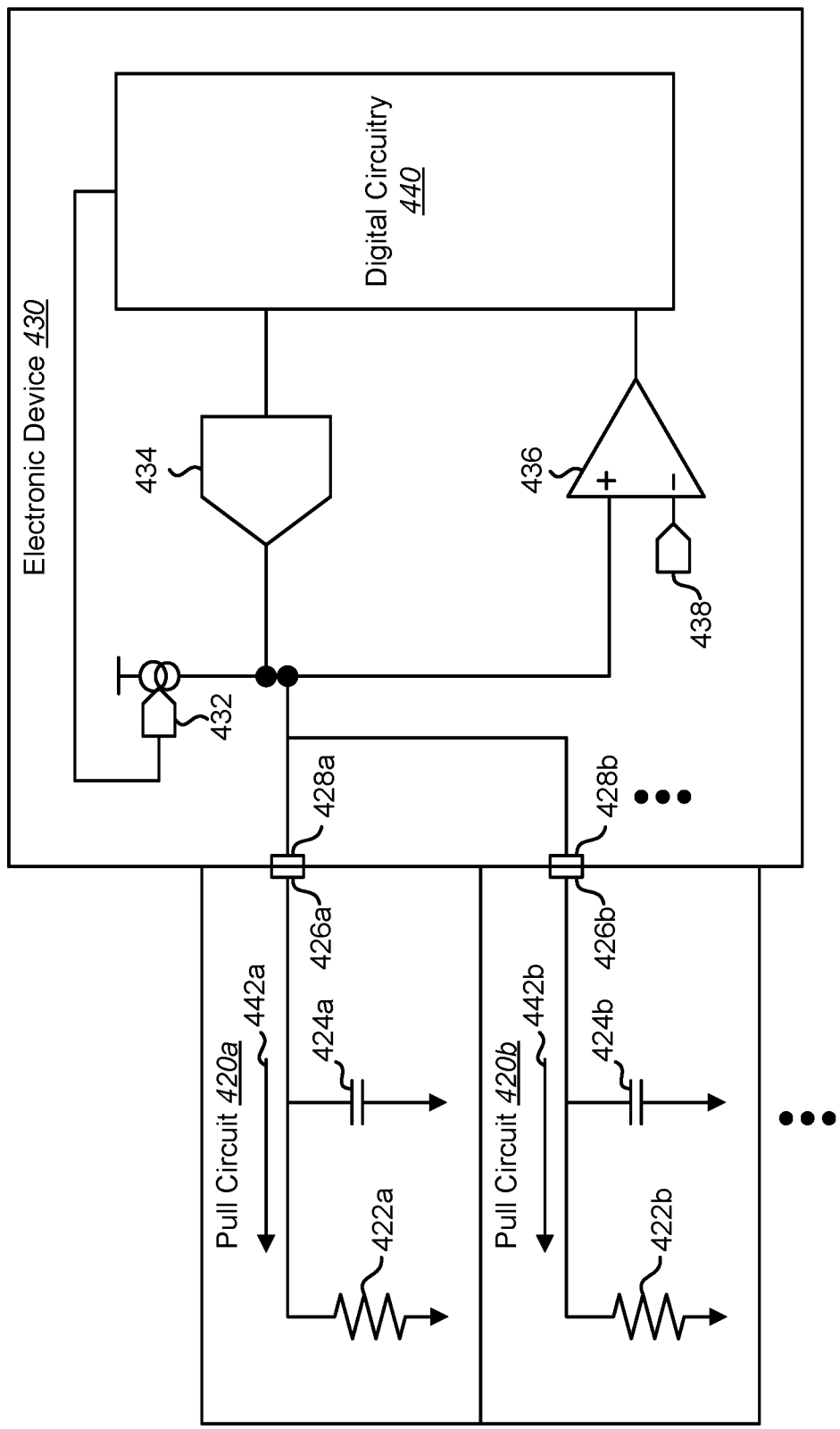
FIG. 4A is a block diagram illustrating an example of an electronic device and pull circuits.

FIG. 4A is a block diagram illustrating an example of an electronic device 430 and pull circuits 420a-b. In particular, FIG. 4A illustrates an example of a technique to detect or determine whether contacts 428a-b (e.g., contacts of a shared line) are connected to integrated circuits (e.g., contact pads 456a-b). The electronic device 430 described in connection with FIG. 4A may be an example of the electronic device 102 described in connection with FIG. 1, and the contacts 428a-b may be examples of the third contacts 118 described in connection with FIG. 1. In some examples, the electronic device 430 may be a printer.

In the example of FIG. 4A, the electronic device 430 includes a current digital-to-analog converter (IDAC) 432, an analog-to-digital converter (ADC) 434 (e.g., a 10-bit ADC), a comparator 436, a reference voltage (Vref) 438, contacts 428a-b, and digital circuitry 440. A component or components of the electronic device 430 (e.g., IDAC 432, ADC 434, comparator 436, and/or digital circuitry 440) may be included in the circuitry 110 described in connection with FIG. 1 in some examples.

In some examples, the pull circuits 420a-b may be examples of the pull circuits described herein and/or may be part of and/or coupled to some of the integrated circuits (e.g., dies, slivers, etc.) described herein. In some examples, the pull circuits 420a-b may respectively be part of and/or coupled to respective dies of a print head or print heads of a print cartridge or print cartridges. Each of the pull circuits 420a-b respectively includes a pulldown resistor (Rpulldown) 422a-b, a parasitic capacitance (Cparasitic) 424a-b, and a contact pad 426a-b. While two pull circuits 420a-b and contacts 428a-b are illustrated in FIG. 4A, other examples may include more than two pull circuits 420a-b and/or contacts 428a-b.

Contact 428a-b and/or pull circuit 420a-b connectivity can be detected using various techniques. One example of contact 428a-b connection detection is described as follows. Other detection techniques may be utilized in accordance with the techniques described herein.

The example described with reference to FIG. 4A may be referred to as an analog approach. This analog approach may utilize a current source and an ADC 434 and/or an analog comparator 436. The digital circuitry 440 may include and/or provide a control for the current source IDAC 432. When determining whether the first contact 428a is connected, the first pull circuit 420a may be enabled or active while the second pull circuit 420b is disabled or inactive based on the states of other lines as described herein. Accordingly, the current source may be applied to the first contact 428a (e.g., input/output (I/O) contact), which may cause a first current 442a (denoted Icurrent_source) to flow into the first pull circuit 420a. The voltage on the first contact 428a and/or the first pull circuit 420a may be expressed as Icurrent_source*Rpulldown when the first pull circuit 420a is connected to the first contact 428a.

The digital circuitry 440 may measure the voltage on the first contact 428a via the ADC 434 and/or via the analog comparator 436. For example, the analog comparator 436 may indicate whether the voltage on the first contact 428a is above or below a threshold (e.g., Vref 438). The voltage measurement may indicate whether the first contact 428a is connected (e.g., if the voltage is at an expected level, within a threshold range, or satisfies a threshold) or open. The digital circuitry 440 may indicate whether the first contact 428a is connected or open based on the voltage measurement. When the second contact 428b is being tested, the first pull circuit 420a may be disabled and the second pull circuit 420b may be enabled in accordance with the techniques described herein, allowing for current 442b to flow into the second pull circuit 420b and measurement of the second contact 428b to be performed.

It is noted that a threshold for pulldown resistance may be changed in some examples. For instance, the current source (e.g., IDAC 432), comparator 436 (e.g., Vref 438), and/or an ADC target may be modified.

Figure 4B:
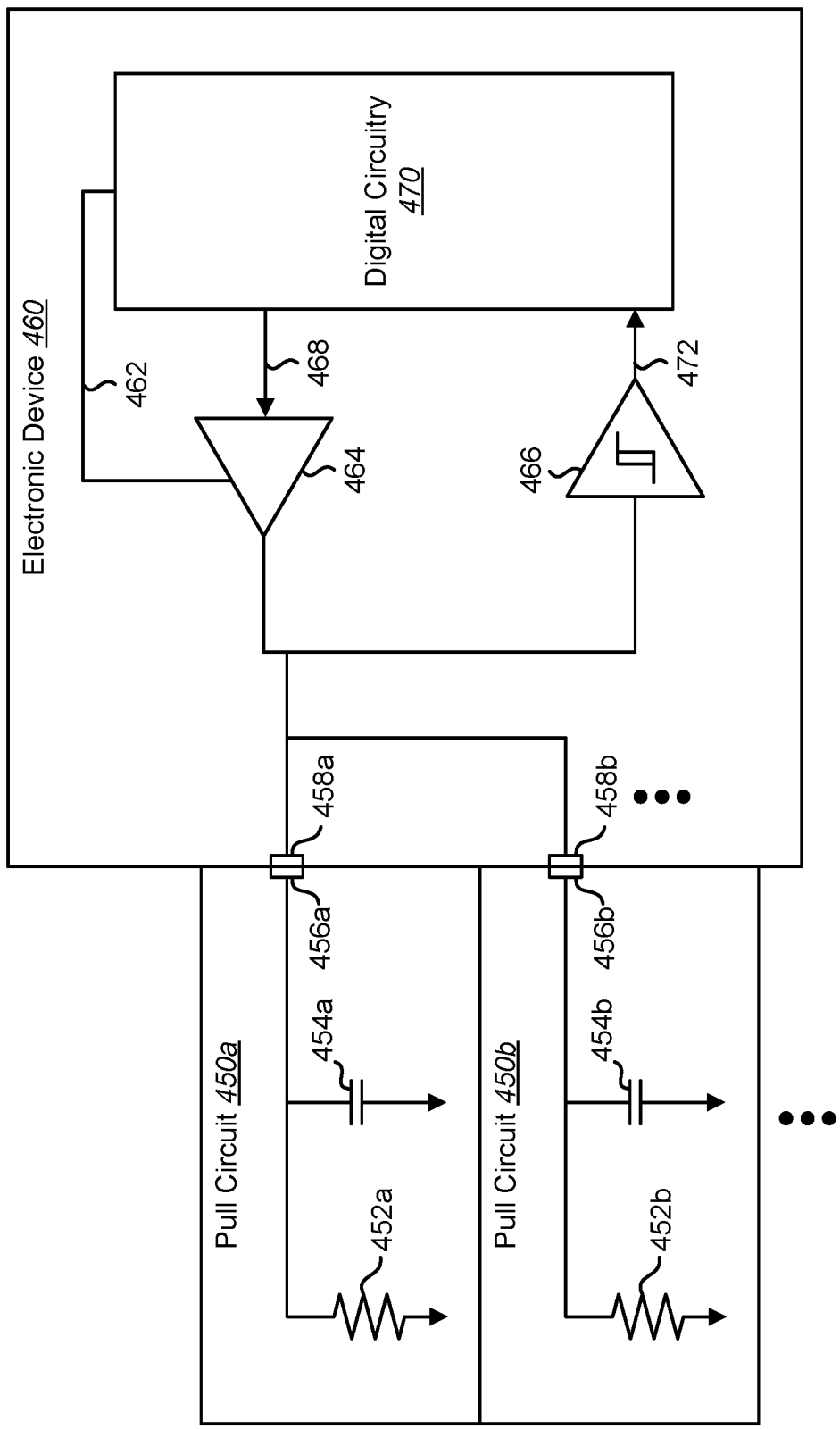
FIG. 4B is a block diagram illustrating an example of an electronic device and pull circuits.

FIG. 4B is a block diagram illustrating an example of an electronic device 460 and pull circuits 450a-b. In particular, FIG. 4B illustrates an example of a technique to detect or determine whether contacts 458a-b (e.g., contacts of a shared line) are connected to integrated circuits (e.g., contact pads 456a-b). The electronic device 460 described in connection with FIG. 4B may be an example of the electronic device 102 described in connection with FIG. 1, and the contacts 458a-b may be examples of the third contacts 118 described in connection with FIG. 1. In some examples, the electronic device 460 may be a printer.

In the example of FIG. 4B, the electronic device 460 includes a digital output driver 464, a Schmitt trigger 466, contacts 458a-b, and digital circuitry 470. A component or components of the electronic device 460 (e.g., digital output driver 464, Schmitt trigger 466, and/or digital circuitry 470) may be included in the circuitry 110 described in connection with FIG. 1 in some examples.

In some examples, the pull circuits 450a-b may be examples of the pull circuits described herein and/or may be part of and/or coupled to some of the integrated circuits (e.g., dies, slivers, etc.) described herein. In some examples, the pull circuits 450a-b may respectively be part of and/or coupled to respective dies of a print head or print heads of a print cartridge or print cartridges. Each of the pull circuits 450a-b respectively includes a pulldown resistor (Rpulldown) 452a-b, a parasitic capacitance (Cparasitic) 454a-b, and a contact pad 456a-b. While two pull circuits 450a-b and contacts 458a-b are illustrated in FIG. 4B, other examples may include more than two pull circuits 450a-b and/or contacts 458a-b.

Contact 458a-b and/or pull circuit 450a-b connectivity can be detected using various techniques. One example of contact 458a-b connection detection is described as follows. Other detection techniques may be utilized in accordance with the techniques described herein.

The example described with reference to FIG. 4B may be referred to as a digital approach. This digital approach may utilize a digital output driver 464 and/or a Schmitt trigger 466. The digital circuitry 470 may provide an output enable signal 462 (e.g., tristate control signal) to the digital output driver 464. The digital output driver 464 may receive an output value 468 from the digital circuitry 470. The Schmitt trigger 466 may provide an input value 472 (e.g., a digital input) to the digital circuitry 470. For example, the Schmitt trigger may measure a quantity (e.g., voltage) of a contact. The digital circuitry 470 may utilize the output enable signal 462 (e.g., pad control), a digital timer, and a latched input value 472 to perform digital pulldown detection.

When determining whether the first contact 458a is connected, the first pull circuit 450a may be enabled or active while the second pull circuit 450b is disabled or inactive based on the states of other lines as described herein. The digital circuitry 470 may utilize the digital output driver 464 to drive the first contact 458a (e.g., input/output (I/O) contact) high (e.g., to a high logic value, to 1, to a voltage corresponding to a high logic value). The digital circuitry 470 may wait for a settling time (denoted tsettle, for example). The digital circuitry 470 may utilize the output enable signal 462 (tristate control) to set the first contact 458a to high impedance. The digital circuitry 470 may start a timer and determine when the timer reaches a target time. When the target time is reached, the digital circuitry 470 may utilize the Schmitt trigger 466 to read the first contact 458a. If the input value 472 indicates a logic 1 value, the digital circuitry 470 may determine that the first contact 458a is not connected (e.g., that no pulldown is present). If the input value 472 indicates a logic 0 value, the digital circuitry 470 may determine that the first contact 458a is connected (e.g., that a pulldown is present). When the second contact 458b is being tested, the first pull circuit 450a may be disabled and the second pull circuit 450b may be enabled in accordance with the techniques described herein, allowing for a similar procedure to be carried out with the second contact 458b. It is noted that pulldown resistor (Rpulldown) sensitivity may be changed by modifying the digital timer target in some examples.

Figure 5:
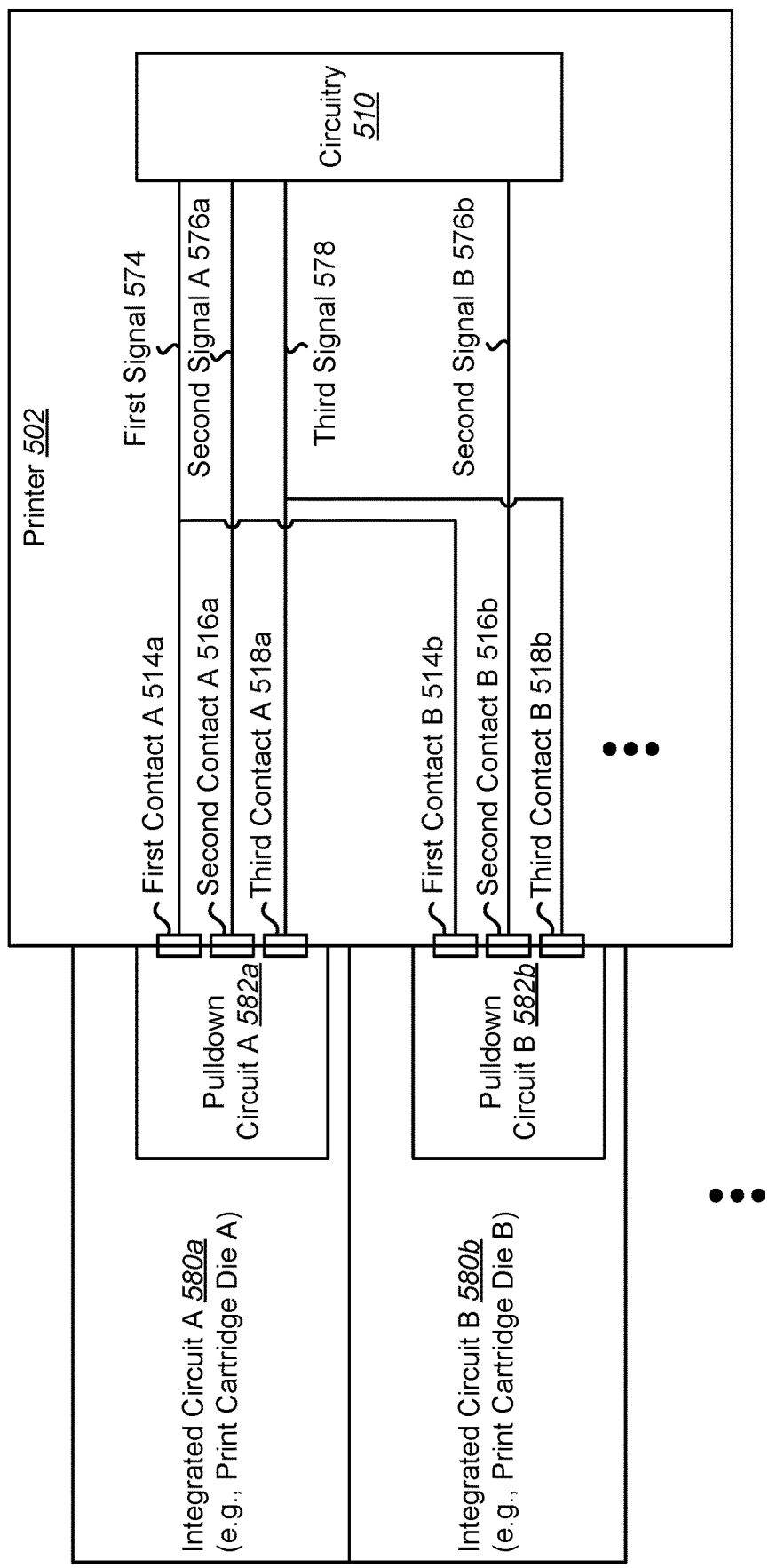
FIG. 5 is a block diagram illustrating an example of a printer.

FIG. 5 is a block diagram illustrating an example of a printer 502. The printer 502 may be an example of the electronic device 102 described in connection with FIG. 1. In the example of FIG. 5, the printer 502 includes a plurality of first contacts 514a-b, a plurality of second contacts 516a-b, and a plurality of third contacts 518a-b. The first contacts 514a-b, the second contacts 516a-b, and the third contacts 518a-b may be examples of corresponding contacts described in connection with FIG. 1. While FIG. 5 illustrates first contacts 514a-b, second contacts 516a-b, and third contacts 518a-b, other examples may include an additional set or sets of contacts with a shared line and/or an additional set or sets of contacts with respective lines. As described above, a shared line may share a signal with all of the contacts of the shared line. For example, a first signal 574 may be shared by all of the plurality of first contacts 514a-b and a third signal 578 may be shared by all of the plurality of third contacts 518a-b. Respective lines are separate from or independent of each other, where respective lines may carry separate or independent signals. For example, each of a plurality of second signals 576a-b may be independent for each of the plurality of second contacts 516a-b.

The printer 502 may be implemented to connect to a plurality of integrated circuits 580a-b. The integrated circuits 580a-b described in connection with FIG. 5 may be examples of the integrated circuits described in connection with FIG. 1. Although integrated circuits 580a-b are illustrated in FIG. 5, additional integrated circuits may be implemented in some examples. In some examples, the integrated circuits 580a-b are a plurality of print cartridge dies. For example, the printer 502 may be implemented to connect to a print cartridge that includes the plurality of print cartridge dies.

Each of the integrated circuits 580a-b may include a pulldown circuit 582a-b. The pulldown circuits 582a-b may be examples of the pull circuits (e.g., pull circuits 420a-b, 450a-b) described herein.

Connectivity of one of the plurality of third contacts 518a-b may be detected based on the first signal 574 and second signal A 576a. For example, the first signal 574 and second signal A 576a may activate pulldown circuit A 582a and the first signal 574 and second signal B 576b may disable pulldown circuit B 582b. As described herein, the circuitry 510 may detect whether third contact A 518a is connected based on the first signal 574 (e.g., while the first signal 574 is a logic state=0), second signal A 576a (e.g., while second signal A 576a is a logic state=0), and second signal B 576b (e.g., while second signal B 576b is a logic state=1).

Some of the techniques described herein may provide various benefits as follows. Some examples enable electrical connectivity verification for all contacts on an electronic device (and/or counterpart contacts on another electronic device). Some examples enable electrical connectivity verification for multiple print cartridges (e.g., both color and black cartridges) when simultaneously present in a system. Some examples provide per-contact open detection (when contacts are coupled to a shared line, for instance). Some examples provide detection of which print head has an open connection or connections when electrical failure occurs. Some examples provide an improved troubleshooting experience when electrical connection failures occur. Some examples allow printer systems to use low cost methods (e.g., charge/bleed) to validate proper electrical connections, including ink shorts and reliability risks.

It should be noted that while various examples of systems and methods are described herein, the disclosure should not be limited to the examples. Variations of the examples described herein may be implemented within the scope of the disclosure. For example, functions, aspects, or elements of the examples described herein may be omitted or combined.

The invention claimed is:

1. An electronic device, comprising:
a first shared line of a plurality of first contacts to respectively connect to a plurality of integrated circuits;
a plurality of second lines of respective second contacts to respectively connect to the plurality of integrated circuits;
a third shared line of a plurality of third contacts to respectively connect to the plurality of integrated circuits; and
circuitry to determine whether one of the plurality of third contacts is connected to an integrated circuit based on whether a pull circuit associated with the plurality of third contacts is active or disabled to verify connectivity of the plurality of third contacts having the third shared line, wherein the pull circuit being active or disabled is based on a state of the first shared line and a state of one of the plurality of second lines that is associated with the one of the plurality of third contacts.

2. The electronic device of claim 1, wherein the circuitry is to determine connectivity of the one of the third contacts when the state of the first shared line is a first state and the state of the one of the plurality of second lines is the first state while a state of each other of the plurality of second lines is a second state.

3. The electronic device of claim 2, wherein the circuitry is to determine connectivity of each of the third contacts by sequentially setting the state of each of the plurality of second lines to the first state.

4. The electronic device of claim 1, wherein the first shared line is a reset line and each of the plurality of second lines is a respective data line.

5. The electronic device of claim 1, wherein the third shared line is clock line, a sense line, or a mode line.

6. The electronic device of claim 1, wherein the electronic device is a printer.

7. The electronic device of claim 1, further comprising a fourth shared line of a plurality of fourth contacts to respectively connect to the plurality of integrated circuits, wherein the circuitry is to determine whether one of the fourth contacts is connected to the integrated circuit based on the state of the first shared line and the state of one of the plurality of second lines that is associated with the one of the fourth contacts.

8. The electronic device of claim 7, further comprising a fifth shared line of a plurality of fifth contacts to respectively connect to the plurality of integrated circuits, wherein the circuitry is to determine whether one of the fifth contacts is connected to the integrated circuit based on the state of the first shared line and the state of one of the plurality of second lines that is associated with the one of the fifth contacts.

9. The electronic device of claim 1, wherein the circuitry is to validate connectivity of each of the plurality of second lines before determining whether the one of the third contacts is connected.

10. The electronic device of claim 1, wherein the plurality of integrated circuits is a plurality of print cartridge dies.

11. The electronic device of claim 1, wherein the pull circuit is active based on the state of the first shared line being a first state and the state of one of the plurality of shared lines being the first state.

12. The electronic device of claim 1, wherein the pull circuit is disabled based on the state of the first shared line being a first state and the state of one of the plurality of shared lines being a second state that is different from the first state.

13. The electronic device of claim 1, wherein the circuitry is further to provide an indicator to be presented on a display that indicates a contact failure of the one of the plurality of third contacts based on the one of the plurality of third contacts not being connected to the integrated circuit.

14. The electronic device of claim 1, wherein the state of the first shared line and the state one of the plurality of second lines are logic levels.

15. The electronic device of claim 1, wherein the state of the first shared line and the state one of the plurality of second lines are voltage level.

16. A method, comprising:
setting a state of a first shared line of first contacts to a first value;
setting a state of one of a plurality of second lines of second contacts to the first value;
setting a state of another of the plurality of second lines of the second contacts to a second value; and
detecting whether one of a plurality of third contacts of a third shared line is connected to an integrated circuit based on whether a pull circuit associated with the plurality of third contacts is active or disabled to verify connectivity of the plurality of third contacts having the third shared line, wherein the pull circuit being active or disabled is based on the state of the first shared line and the states of the plurality of second lines.

17. The method of claim 16, further comprising, in response to detecting that the one of the plurality of third contacts is connected, detecting whether one of a plurality of fourth contacts is connected to the integrated circuit based on the state of the first shared line and the states of the plurality of second lines.

18. The method of claim 16, wherein detecting whether the one of the plurality of third contacts is connected comprises measuring a voltage of the one of the plurality of the third contacts when the state of the first shared line is set to 0, the state of the one of the plurality of second lines is set to 0, and the state of the other of the plurality of second lines is set to 1.

19. A printer, comprising:
a plurality of first contacts, wherein a first signal is to be shared by all of the plurality of first contacts;
a plurality of second contacts, wherein each of a plurality of second signals is to be independent for each of the plurality of second contacts; and
a plurality of third contacts, wherein a third signal is to be shared by all of the plurality of third contacts, and wherein connectivity of one of the plurality of third contacts is to be detected based on whether a pull circuit associated with the plurality of third contacts is active or disabled to verify connectivity of the plurality of third contacts having the third shared line, wherein the pull circuit being active or disabled is based on the first signal and one of the plurality of second signals.

20. The printer of claim 19, wherein the first signal and the one of the plurality of second signals are to activate a first pulldown circuit and the first signal and another of the plurality of second signals are to disable a second pulldown circuit.

* * * * *